(12) United States Patent
Koehler (10) Patent No.: US 7,862,362 B2
(45) Date of Patent: Jan. 4, 2011

(54) TEST HOLDER FOR MICROCHIP

(75) Inventor: Christian Koehler, Chemnitz (DE)

(73) Assignee: Tyco Electronics Amp GmbH, Bensheim (DE)

( * ) Notice: Subject to any disclaimer, the term of this patent is extended or adjusted under 35 U.S.C. 154(b) by 0 days.

(21) Appl. No.: 12/465,683

(22) Filed: May 14, 2009

(65) Prior Publication Data

US 2009/0311913 A1    Dec. 17, 2009

(30) Foreign Application Priority Data

May 15, 2008   (DE) ................ 10 2008 023 640

(51) Int. Cl.
*H01R 13/62* (2006.01)
(52) U.S. Cl. ..................................... 439/331
(58) Field of Classification Search .............. 439/331, 439/341, 342, 71, 73
See application file for complete search history.

(56) References Cited

U.S. PATENT DOCUMENTS 7,001,197 B2 * 2/2006 Shirai et al. ............... 439/331

| | | | |
|---|---|---|---|
| 2006/0105609 A1 * | 5/2006 | Huang et al. | 439/331 |
| 2006/0116015 A1 * | 6/2006 | Ju | 439/331 |
| 2006/0116016 A1 * | 6/2006 | Szu | 439/331 |
| 2006/0121765 A1 * | 6/2006 | Ma | 439/331 |
| 2006/0128201 A1 * | 6/2006 | Ju | 439/331 |
| 2006/0141840 A1 * | 6/2006 | Ma | 439/331 |
| 2006/0148298 A1 * | 7/2006 | Nakao et al. | 439/331 |

* cited by examiner

*Primary Examiner*—T C Patel
*Assistant Examiner*—Harshad C Patel
(74) *Attorney, Agent, or Firm*—Baker & Daniels LLP (57) ABSTRACT

The invention relates to a test holder for fixing the position of a microchip in a microchip contactor, having a base frame and a pressing unit, which is connected to the base frame such that it can be pivoted open or shut and which comprises a pressure body designed to interact with the microchip. In order to press the microchip all over with a uniform pressure onto the contactor, even if the microchip is inclined with respect to the pressing means when it is contacted with the contactor, the invention provides that the pressure body may be tilted about a first and a second tilting axis.

12 Claims, 7 Drawing Sheets

TEST HOLDER FOR MICROCHIP

This application claims priority from German patent application serial number DE102008023640.3 filed May 15, 2008.

The invention relates to a test holder for at least one microchip, having a base frame which comprises at least one central opening, which encloses at least one receptacle for the microchip, and having a pressing means, which is connected to the base frame by way of a pivot bearing such that it can be pivoted open about a pivot axis in the direction away from the central opening and pivoted shut in the direction towards the central opening.

Test holders for microchips are generally known and are often used to secure a microchip in position in a socket or contactor designed for electrical contacting of the microchip. If, in particular, the microchips comprise electrical contacts which rest on the corresponding contacts of the contactor, the above-stated pressing mechanisms are used.

The above-mentioned microchip contacts are for example so-called ball or land grid arrays, in which the microchips comprise roughly hemispherical or flat electrical contact points.

However, test holders may also be used for microchips with differently shaped electrical contacts, in order to ensure their seating in the contactor, for example for life tests.

The base frame of known test holders is connected to the pressing means by way of the pivot axis, which allows the pressing means or the test holder to pivot open, so that the microchip may be inserted into the contactor connected to the base frame.

In the pivoted-shut state of the test holder, the pressing means presses the microchip into the receptacle, surrounded or enclosed by the central opening, for the microchip in the contactor. In this case, it is necessary, in particular for "burn-in tests", for the microchip to be pressed uniformly into the contactor, since uneven loading of the microchips may lead to distorted burn-in test results or even to damage to the microchip.

When producing and servicing known test holders, it is therefore necessary to ensure that, when the test holder is pivoted shut, at least the pressure body of the pressing means is oriented parallel to the microchip located in the contactor and contacted with the contactor.

Since not only the test holder but also the microchip, the contactor and a printed circuit board accommodating the contactor mechanically and electrically and possibly connecting the latter with the test holder are subject to dimensional variations during production, the contact pressure applied to the microchip by the pressure body on pressing the microchip into the contactor is distributed uniformly over the entire contact surface only in exceptional cases due to possible crooked positioning between microchip and pressing means caused by the dimensional variations.

It is therefore the object of the present invention to provide an improved test holder for microchips which ensures uniform pressure loading of the microchip upon pressing of the microchip onto the contactor For the above-stated test holder, the object is achieved according to the invention in that the pressing means is connected tiltably to the base frame by way of a first tilting bearing, which comprises a first tilting axis extending perpendicularly to the pivot axis.

This simple measure makes it possible for the pressing means of the test holder to compensate for a gradient, extending parallel to the pivot axis, of the microchip, when contacted with the contactor, or of the contactor, the printed circuit board or even of the test holder with regard to the pressing means itself by a compensating movement about the first tilting axis, so ensuring uniform pressing of the microchip into the contactor even if one of the above-mentioned components is tilted, as described.

The solution according to the invention may be further improved by various configurations which are each in themselves advantageous and may be combined as desired with one another. These configurations and the associated advantages will be looked into below.

For instance, the pressing means and the base frame may be connected together pivotably by way of a hinge pin, whose longitudinal axis is aligned with the pivot axis and thus forms with the base frame and the pressing means a possibly hinge-type pivot bearing. Both the base frame and the pressing means may comprise receptacles for the hinge pin. This test holder is thus simple to design and produce.

In order to be able simply to insert the microchip through the central opening into the contactor, the pressing means may be pivotable about the pivot axis by at least 90° relative to the base frame.

The receptacles for the hinge pin in the base frame may be formed on one side of the base frame at the maximum possible distance from one another. The receptacles may be shaped to fit the hinge pin, so accommodating the hinge pin as far as possible without play and optionally rotatably. Receptacles shaped in this way allow precise positioning of the hinge pin. So that the longitudinal axis of the hinge pin is aligned with the pivot axis in the mounted state, axes of symmetry of the optionally rotationally symmetrically shaped mounts may be arranged along the pivot axis.

The receptacles for the hinge pin provided in the base frame may be configured on the inside such that the hinge pin may rotate almost frictionlessly about the pivot axis. To this end, the inner walls of the mounts may be coated for example with a solid lubricant or the hinge pin may be connected rotatably to the receptacles by way of a ball bearing.

To connect the base frame mechanically to the contactor or to a printed circuit board bearing the contactor, the base frame may comprise at least two openings extending parallel to the central opening for screws or dowel pins, by means of which the base frame may be connected non-displaceably and possibly also electrically conductively to the contactor or the printed circuit board.

If the test holder contactor has been mounted on the printed circuit board, the contactor may be located in centred manner beneath the central opening and project at least partially into the receptacle for the microchip. The contactor may be arranged in the centre of the receptacle for the microchip at the opposite end of the central opening from the pressing means, the receptacle possibly being arranged in centred manner in the central opening. The contactor may be replaced, for example in the event of servicing, without the test holder having to be dismantled. The test holder may alternatively also be mounted on the contactor.

The lid frame of the pressing means may likewise comprise at least one receptacle for the hinge pin, which receptacle may be arranged in particular centrally between the receptacles of the base frame when the pressing means is in the mounted state. The diameter of this receptacle may be larger than the diameter of the hinge pin, such that the pressing means may be connected to the hinge pin so as also to be movable about other axes than the pivot axis.

The profile of the receptacle may comprise a tapered zone, which may for example comprise a square cross-section, which may be oriented perpendicularly to the pivot axis. A pressing means with such a receptacle for the hinge pin may be restricted in its mobility to movements about the pivot axis and about one second movement axis. If, in particular, one of the sides of the square cross-section of the receptacle extends substantially parallel to the base frame when the pressing means is pivoted shut, the second movement axis may be aligned with the first tilting axis.

The receptacle of the pressing means for the hinge pin may thus form, together with the hinge pin, at least part of a first tilting bearing, whose bearing axis may coincide with the first tilting axis.

In order to fix the position of the pressing unit along the pivot axis with regard to the base frame, the lid frame may comprise at least two limit stops, which are arranged on each side of the receptacle for the hinge pin of the lid frame and rest substantially against the mutually opposing sides of the receptacles for the hinge pin of the base frame when the pressing means is in the mounted state. The limit stops may be formed on the lid frame in such a way that they allow and at the same time limit a tilting angle of the first tilting bearing, i.e. tilting of the pressing means about the first tilting axis. In particular, the limit stops may also take the form of bores, through which the hinge pin extends, the internal diameter thereof possibly being larger than the diameter of the hinge pin.

In order also to be able to compensate inclined positions of the microchip fully contacted with the contactor with regard to the pressure body about an axis extending parallel to the pivot axis, the lid frame may accommodate a pressure body by way of a second tilting bearing, which may be tilted not only together with the lid frame about the first tilting axis but additionally also about a second tilting axis, which may be aligned with a bearing axis of the second tilting bearing. It is thus possible not only to compensate in each case the gradient extending in the direction of one of the two tilting axes between the surface of the microchip directed towards the pressing means and the base frame or the pressing unit, but also simultaneous inclined positions in combined tilting means about the tilting axes.

In order not to apply an off-centre load to the microchip, the first and second tilting axes may intersect with one another over a point which lies at the geometric midpoint of the microchip when the test holder is closed and equipped with the microchip or at the midpoint of the receptacle for the microchip. In this case, the tilting axes may extend in a common plane and intersect at said point or pass at a distance from one another. The two tilting axes may also be oriented perpendicularly to one another, such that gradients of the surface of the microchip relative to the side of the pressure body facing the microchip may be uniformly compensated parallel to the tilting axes. The side of the pressure body facing the central opening when the pressing means is in the closed state may be conformed to the shape of the microchip, in order to prevent punctiform loading of the microchip.

To make the pressure body movable about the second tilting axis, the pressure body may be connected tiltably to the lid frame, the tilting axis of the pressure body preferably being aligned with the second tilting axis. To this end, the lid frame and the pressure body may be connected together by way of the second tilting bearing, which may comprise at least two mutually opposing rotational bearings, whose bearing axes are aligned with the second tilting axis.

Each of the two tilting bearings may comprise an at least partially circular-cylindrical connecting pin. Pin receptacles passing through opposing sides of the lid frame may be provided for the connecting pin, through which pin receptacles the pin may be inserted from the outside towards an opening provided in the lid frame for accommodating the pressure body and, when inserted, the connecting pin projects into the receptacle provided for the pressure body in the lid frame. The pin receptacles may extend along the second tilting axis parallel to the pivot axis and spaced therefrom.

On two opposing sides, the pressure body may comprise bores, which may also take the form of blind holes, for accommodating the connecting pins. These bores may also extend along the second tilting axis when the pressure body is in the mounted state.

The bores or pin receptacles accommodating the connecting pin are so shaped that they accommodate the connecting pin such that it is rotatable substantially without play. In this respect, the insides of the bores or the pin receptacles may for example be provided with a solid lubricant or take the form of a ball bearing, such that the lid frame may be tiltable with as little friction as possible about the second tilting axis.

The second tilting bearing may however also take the form of a height adjusting means, such that, by changing the position of at least part of the second tilting bearing, the distance of the pressure body from the opposite end of the central opening of the base frame when the pressing means is in the mounted and pivoted-shut state may be varied. Thus, even microchips with different heights may be held in the contactor by the test holder, without the test holder having to be exchanged at least in part.

To this end, the connecting pin may for example comprise two pegs, which are connected together rigidly via a retaining web extending for example perpendicularly thereto. The pegs may be cylindrical with a circular base, and may extend parallel and at a distance from one another, i.e. eccentrically. The longitudinal axis of the first peg may be aligned, in the mounted state, with the second tilting axis. In particular, said first peg may be the peg which is accommodated by one the bores of the pressure body. If, when the pressing means is in the pivoted-shut or closed state, the connecting web points from the first peg or indeed pressure body peg towards the opposing side of the central opening, the pressure body is arranged in an upper position. If the connecting pin is rotated by 180° about the longitudinal axis of the second peg provided in the pin receptacle of the lid frame, the pressure body is arranged in a lower position, thus closer to the opposing side of the central opening. The difference in distances between the side of the pressure body facing the central opening and the opposite end of the opening is dependent on the length of the connecting web disposed parallel to this direction or on the spacing of the longitudinal axes of the two pegs.

The width of the connecting web extending parallel to the second tilting axis requires a sufficient gap between pressure body and lid frame. If the gap between pressure body and lid frame needs to be as small as possible, the connecting pin may also be differently shaped. In particular, the connecting pin may consist of two pegs with different diameters. The peg with the smaller diameter may be accommodated by the pressure plate, the longitudinal axis of this peg being aligned with the second tilting axis.

For the second, larger peg, corresponding pin receptacles are provided in the lid frame. The second peg is arranged in the lid frame in such a way that it may be rotated about its longitudinal axis extending parallel to and at a distance from the second tilting axis. If the first peg is then arranged off-centre and in particular at the edge of the second peg, the mode of operation for modifying the height position of the pressure body corresponds to the above-described function of the connecting pin taking the form of two pegs connected eccentrically via a connecting web. The difference between the high and low positions of the pressure body is a result of the spacing of the longitudinal axes of the two pegs.

The cross-sections of the receptacles for the second peg and the cross-section of the second peg may be complementary to one another in shape and in particular point-symmetrical in themselves, i.e. for example circular or square. Thus, the connecting pins may be inserted into the receptacles at least in two predetermined orientations.

For simple mounting of the connecting pins, these may be joined together with a spring clip. The spring clip may be U-shaped and designed with two webs pointing in one direction. The connecting pins may comprise receiving bores for one of the webs, the bore possibly extending perpendicularly to a surface defined by the longitudinal axes of the receiving pins.

With the spring clip the connecting pins may thus be inserted simply and uniformly into the openings provided therefor. Once the connecting pins have been positioned in the openings, the spring clip may be simply withdrawn from the bores in the connecting pins provided for the spring clip or left therein, in order to fix the position of the connecting pins.

As a result of the orientation of the bore for the spring clip in the connecting pins, the connecting pins are oriented beforehand in two positions, either in the upper or in the lower mounting position of the pressure body, if the mounting clip is oriented substantially parallel to the surface defined by the pivot axis and the first tilting axis.

To hold the pressing means in the closed state, a closing mechanism, for example in the form of an L-shaped closing lever, may be provided, which may be connected rotatably to the base frame on the opposite side from the pivot axis and on this side may comprise a projection or a bulge, which may press the pressing means towards the base frame when the lever is in the pivoted-shut state, whereby the pressing means is closed and secured against undesired opening. The closing mechanism may press the pressing means towards the base frame in particular symmetrically relative to the first tilting axis, so making it possible to prevent greater loading of the microchip on one side of the first tilting axis. The base frame may comprise a hook-on device for the lever, such that the latter may be fixed in the position pressing the pressing means towards the base frame.

A contact pressure specific to the microchip may be predetermined by the resilience and geometric configuration of the closing lever or indeed by the configuration of the hook-on device or of the lid frame. The contact pressure may be varied by adaptation of the second tilting bearing or by replacement of the closing lever with for example a different geometry or a different material. In this way, the contact pressure may be adapted to the requirements of the respective microchip by changing the spring constant and/or spring excursion.

To ensure the lid frame remains tiltable about the first tilting axis, even if the protrusion is resting on the side of the lid frame facing away from the base frame, a bearing may be provided on this side of the lid frame, on which bearing the protrusion of the closing lever rests and by means of which the closing lever introduces the contact pressure into the lid frame.

The bearing may for example take the form of a cylinder with a round base, whose longitudinal axis is aligned with the first tilting axis. The cylinder may be cut parallel to its longitudinal axis and the arising section plane may rest on the lid frame. The part of the protrusion resting on the bearing in such a manner as to be tiltable about the first tilting axis in the pivoted-shut or closed state of the pressing means may be conformed to the shape of the bearing and in particular shaped to be at least partially complementary. In this configuration the bearing thus takes the form of a plain bearing.

In a simpler embodiment the bearing takes the form for example of a cylinder with a triangular base. The longitudinal axis of the bearing may extend parallel to the first tilting axis. In particular, the apex, pointing away from the base frame, of the triangle forming the base of the cylinder may coincide with the first tilting axis. The bearing may also be pyramidal in shape, its apex lying on the first tilting axis.

The bearing surface of the lid frame may also be flat and the bearing may be arranged on the side of the protrusion directed towards the lid frame.

In particular, the bearing axis of the bearing may be aligned with the first tilting axis.

The invention is explained below by way of example by means of exemplary embodiments and with reference to the drawings. The various features of the embodiments may be combined mutually independently, as has already been explained with reference to the individual advantageous configurations.

Figure 1:
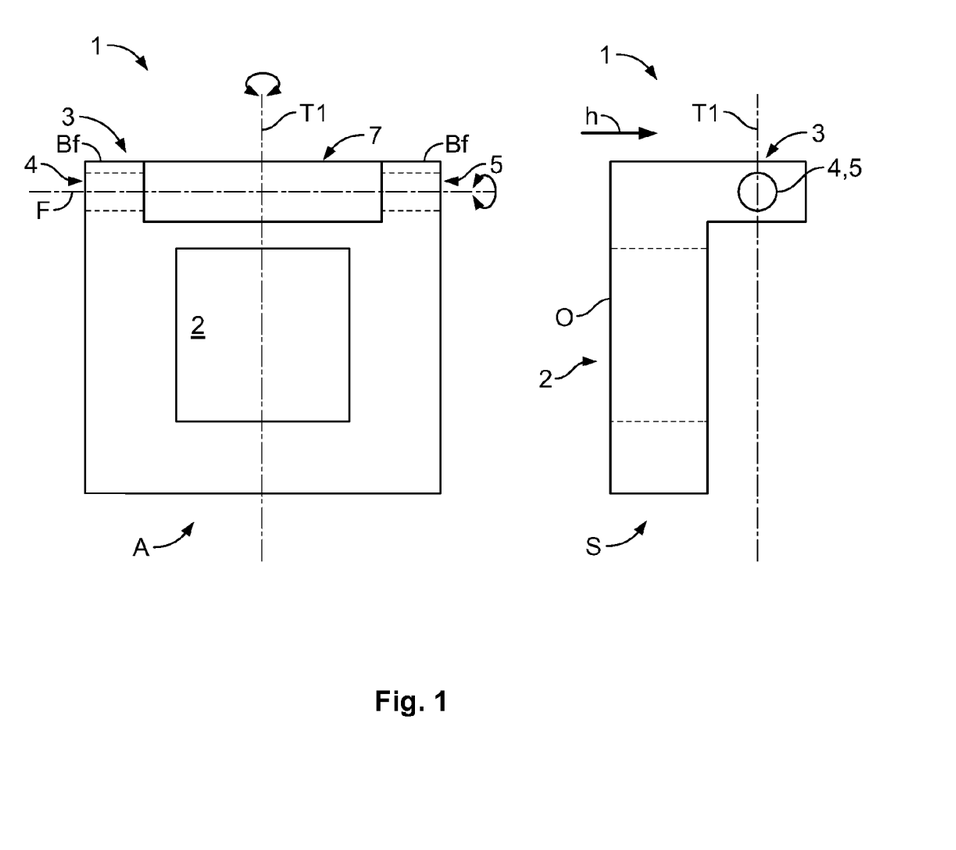
FIG. 1 is a schematic representation of a first exemplary embodiment of the test holder according to the invention showing a base frame.

First of all, the structure and function of a base frame 1 according to the invention will be described with reference to the exemplary embodiment of FIG. 1. FIG. 1 shows the base frame 1 in a plan view A and a side view S. As is clear from plan view A, the base frame 1 has a substantially rectangular outline. The base frame 1 exhibits a central opening 2, which encloses a receptacle for a microchip, through which the microchip may be inserted into a contactor, not shown. The central opening 2 is formed, as is apparent from the side view, as a hole through the base frame 1.

At one side 3 of the base frame 1 there are shown two receptacles 4, 5, which are components of a pivot bearing Bf connecting the base frame 1 to a pressing means 6, not shown here. The receptacles 4, 5 are formed in the outer regions, i.e. at opposing ends, of side 3, and project beyond the base frame 1 in a height direction h, as is clear from side view S. Between the receptacles 4, 5 a recess 7 is provided, into which a part of the pressing means 6 forming a further component of the pivot bearing Bf may be inserted. The pressing means 6 may be pivoted open or shut relative to the base frame 1 about a pivot axis F illustrated here as a dash-dotted line.

The pivot axis F and a first tilting axis T1 here shown as a dash-dotted line are shown to be arranged perpendicular to one another.

The base frame 1 may comprise at least two holes extending parallel to the central opening, via which it may be connected non-displaceably for example by screws or dowel pins to a printed circuit board or to a contactor for accommodating a microchip. When the base frame is mounted on the printed circuit board, which may be equipped with the contactor, or on the contactor, the contactor is situated beneath the central opening 2 or the receptacle for the microchip and may project at least in part into the central opening 2. The microchip may be inserted into the contactor through the receptacle for the microchip.

Figure 2:
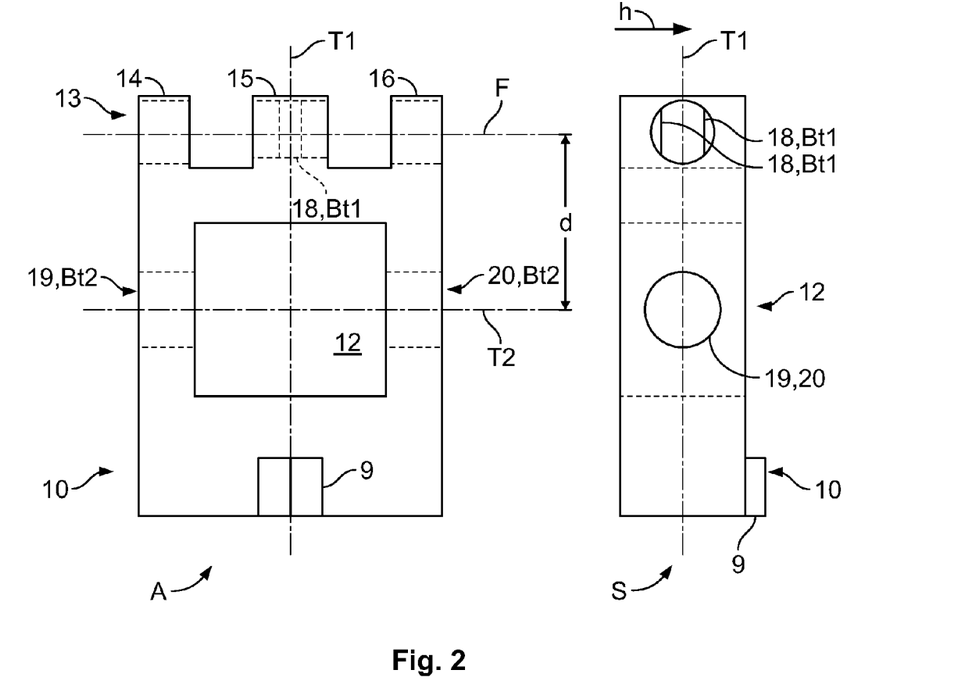
FIG. 2 is a schematic representation of a second exemplary embodiment of the invention showing a lid frame.

FIG. 2 shows a further exemplary embodiment of the test holder H according to the invention, the same reference signs being used for elements which correspond in function and structure to the elements of the exemplary embodiment of FIG. 1. For the sake of brevity, only the differences from the exemplary embodiment of FIG. 1 will be looked at.

The pressing means 6 comprises a lid frame 10 provided with a bearing 9, FIG. 2 again showing the lid frame 10 in a plan view A and a side view S. The lid frame 10 comprises an opening 12 for accommodating a pressure body 11, not shown here. The opening 12 is shown as a hole through the lid frame 10 extending perpendicularly to the major faces of the lid frame 10, but may however also be closed at the side remote from the base frame 1 in the mounted state.

The bearing 9 extends in the height direction h, the bearing axis thereof extending parallel to the first tilting axis T1 and being at least partially superposed on the latter in plan view A. In particular, the bearing may be configured such that it allows tilting of the lid frame 10 in the mounted state thereof when the pressing means 6 has been pivoted shut.

In the outer region of one side 13, opposite the side on which the bearing 9 is provided, two bores 14, 16 and a receptacle 15 arranged between the bores 14, 16 are shown, of which at least the receptacle 15, together with the receptacles 4, 5 of the base frame 1 and a hinge pin 17, not shown here, form the pivot bearing Bf The bores 14, 16 and the receptacle 15 extend along the pivot axis F, the midpoints of the bores 14, 16 and the receptacle 15 lying on the pivot axis F. The diameter of the bores 14, 16 is greater than the diameter of the receptacles 4, 5 of the base frame 1, which are designed to fit the hinge pin 17. The receptacle 15 located centrally between the bores 14, 16 comprises a tapered region 18, which, with the hinge pin 17, is part of a first tilting bearing Bt1, whose bearing axis is aligned with the first tilting axis T1. The bores 14, 16 having a larger diameter than the hinge pin 17 serve as limit stops for the first tilting bearing Bt1, which restrict a possible angle of tilt about the first tilting axis T1.

Two pin receptacles 19, 20 are provided in the lid frame 10 parallel to the bores 14, 16, to accommodate connecting pins 21 not shown here. The longitudinal axes of the rotationally symmetrical holes 19, 20 are aligned with a second tilting axis T2, which extends perpendicularly to the first tilting axis T1 at a distance d from the pivot axis F. The receptacles 19, 20 are of substantially identical diameter, this corresponding roughly to the diameter of the connecting pins 21 in this region, whereby the connecting pins may be introduced rotatably into the openings 19, 20 with as little play as possible. If the connecting pins 21 do not have a rotationally symmetrical or round cross-section, the receptacles 19, 20 may be different in shape and in particular complementary to the cross-section of the connecting pins 21. The connecting pins 21 interact with the pin receptacles 19, 20 to form parts of a second tilting bearing Bt2.

Figure 3:
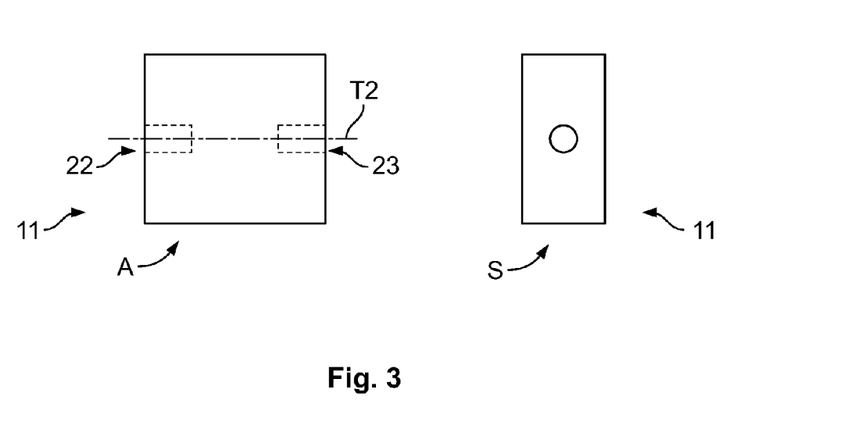
FIG. 3 is a schematic representation of a third exemplary embodiment of the invention showing a pressure body according to the invention.

FIG. 3 shows a third exemplary embodiment, the same reference signs being used for elements which correspond in function and structure to the elements of the exemplary embodiment of FIGS. 1 or 2. For the sake of brevity, only the differences from the previous exemplary embodiments will be looked at.

FIG. 3 shows the pressure body 11 in a plan view A and a side view S. The pressure body 11 formed as a right cylinder here comprises a substantially square base, which may however also be different from the shape of the microchip and in particular rectangular. In the region of two mutually opposing sides, two bores 22 and 23 are provided centrally for partial reception in each case of a connecting pin 21. The bores 22, 23, whose longitudinal axis is aligned with the second tilting axis T2 when the pressure body is in the mounted state, form with the connecting pins 21 and the receptacles 19, 20 of the lid frame 10 the second tilting bearing Bt2, by means of which the pressure body 11 is mounted in the lid frame 10 so as to be tiltable about the second tilting axis T2 relative to the lid frame 10.

Figure 4:
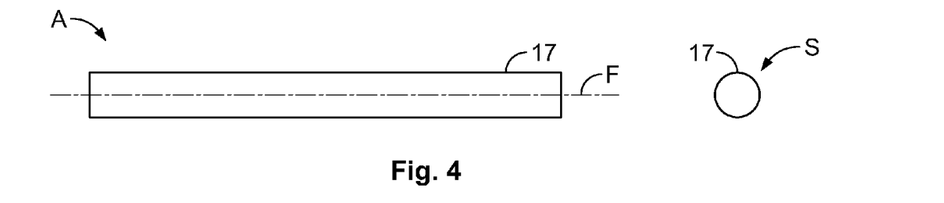
FIG. 4 is a schematic representation of a cylindrical hinge pin of the present invention.

FIG. 4 shows a fourth exemplary embodiment, the same reference signs being used for elements which correspond in function and structure to the elements of the exemplary embodiments of the previous Figures. For the sake of brevity, only the differences from the previous exemplary embodiments will be looked at.

FIG. 4 shows the hinge pin 17 in a plan view A and a side view S. The longitudinal axis of the hinge pin 17 is aligned, in the mounted state, with the pivot axis F. The hinge pin 17 is here cylindrical in shape, with a circular base. At its ends the hinge pin 17 may for example comprise bores for accommodating split pins, which prevent or limit displacement of the hinge pin 17 in the direction of the pivot axis F when the hinge pin 17 is in the mounted state.

Figure 5:
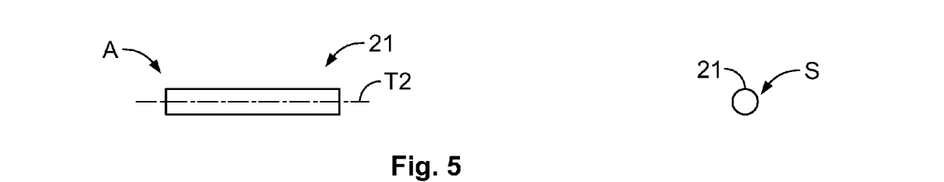
FIG. 5 is a schematic representation of a further exemplary embodiment of the test holder according to the invention showing a connecting pin.
Figure 6:
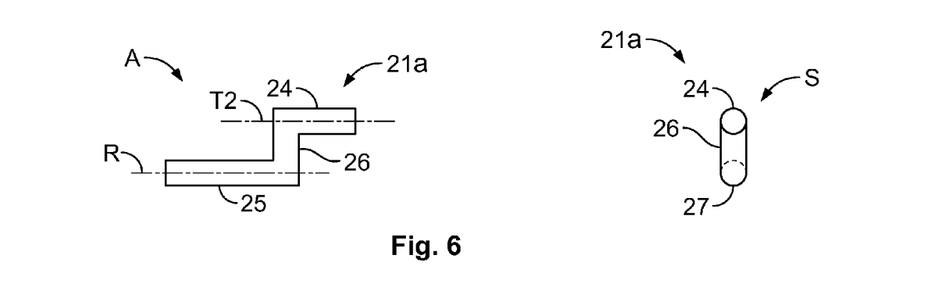
FIG. 6 is a schematic representation of a further exemplary embodiment of the connecting pin according to the invention, which differs from the first exemplary embodiment by having two pegs.
Figure 7:
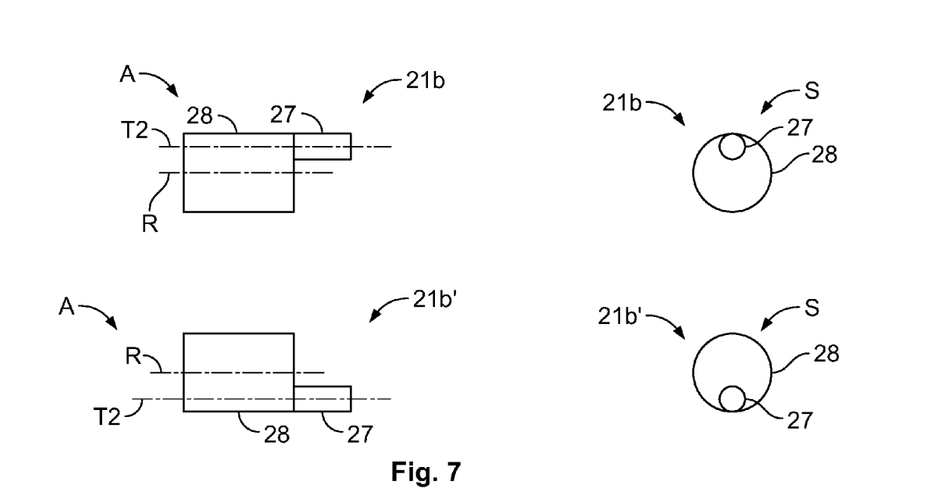
FIG. 7 is a schematic representation of a third exemplary embodiment of the connecting pin according to the invention.

FIGS. 5 to 7 shows three exemplary embodiments of the connecting pins 21 according to the invention, the same reference signs being used for elements which correspond in function and structure to the elements of the exemplary embodiments of the previous Figures. For the sake of brevity, only the differences from the previous exemplary embodiments will be looked at.

FIG. 5 shows a connecting pin 21 in a plan view A and a side view S. As is apparent from the side view, the connecting pin 21 has a circular base. The plan view shows that the connecting pin 21 is of cylindrical configuration. Its longitudinal axis is aligned, in the mounted state, with the second tilting axis.

In FIG. 6 the connecting pin 21 comprises two pegs extending parallel to one another and a distance from one another, these being connected together rigidly. As is shown in the plan view of FIG. 6, the longitudinal axis of a first, here shorter peg 24 is aligned in the mounted state with the second tilting axis T2. A web 26 connecting the peg 24 rigidly with the longer peg 25 extending parallel thereto here extends perpendicularly to the longitudinal axis R of the second peg 25 and the second tilting axis T2 of the peg 24. In the mounted state the connecting pin 21a is accommodated rotatably in one of the receptacles 19, 20 of the lid frame 10 and is part of a height-adjusting means. The pegs 24, 25 extend in opposing directions and are connected together at in each case one of their ends by means of the connecting web 26. As is clear from the side view of FIG. 6, the first and second pegs 24, 25 have circular bases.

FIG. 7 shows as two further exemplary embodiments the connecting pins 21*b*, 21*b'*, which likewise comprise a first peg 27 and a second peg 28. In comparison to the first peg 27, the second peg 28 here has a markedly larger diameter. Both pegs here comprise a circular base, as is apparent from the side view S. The base of the second peg 28 in particular may, however, also be of a different shape, for example quadrilateral, providing the base of the second peg 28 is in itself point-symmetrical.

The longitudinal axis of the first peg 27 is aligned, in the mounted state of the connecting pin 21*b*, 21*b'*, with the second tilting axis T2. The longitudinal axis R of the second peg 28 extends parallel to and at a distance from the longitudinal axis of the first peg 27. In the exemplary embodiment shown here, the first and second pegs are connected together at in each case one end face and the first peg 27 is arranged eccentrically, such that it lies in a peripheral region of the peg 28. In the exemplary embodiment shown of the connecting pin 21*b*, the first peg 27 is arranged in particular in the upper region of the second peg 28.

Unlike the connecting pin 21*b*, the connecting pin 21*b'* is rotated by 180° about the longitudinal axis R, such that the first peg 27 is now illustrated in a lower region of the second peg 28, so illustrating the principle of the height-adjusting means.

Figure 8:
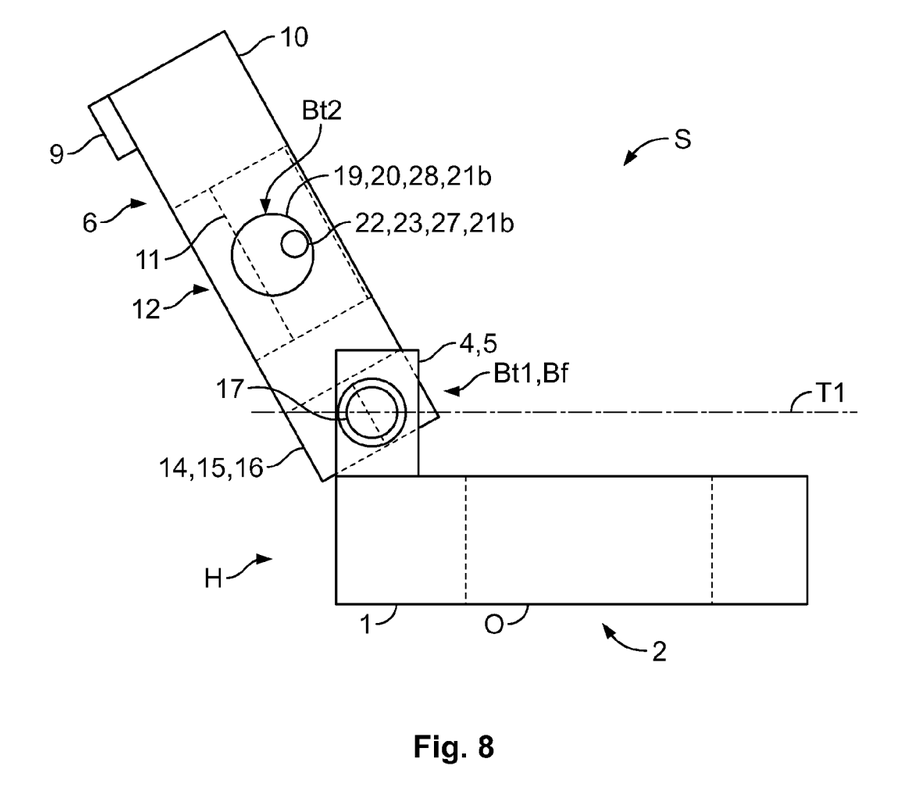
FIG. 8 is a schematic representation in side view of the test holder according to the invention.

FIG. 8 shows a further exemplary embodiment, the same reference signs being used for elements which correspond in function and structure to the elements of the exemplary embodiments of the previous Figures. For the sake of brevity, only the differences from the previous exemplary embodiments will be looked at.

The test holder H is here shown in a side view S with the base frame 1 and the pressing means 6 in the mounted, pivoted-open state. The pressing means 6 comprises the lid frame 10 with the bearing 9, the lid frame being connected rotatably to the pressure body 11 by means of connecting pins 21*b'* provided in the receptacles 19, 20, 22, 23. The pressing means 6 is shown to be pivoted open by more than 90° about the pivot axis F relative to the base frame 1. In the closed state the pressing means 6 rests inter alia on the bearing 9 and may be tilted about the first tilting axis T1, which is aligned with the bearing axis of the bearing 9, as far as a maximum tilting angle about the first tilting axis T1 limited by the bores 14, 16.

The second tilting axis T2 is not shown here, but extends perpendicularly to the first tilting axis T1 along the longitudinal axes of the pegs 27 of the connecting pins 21*b*. The pressure body 11 may be tilted about the second tilting axis T2.

Figure 9:
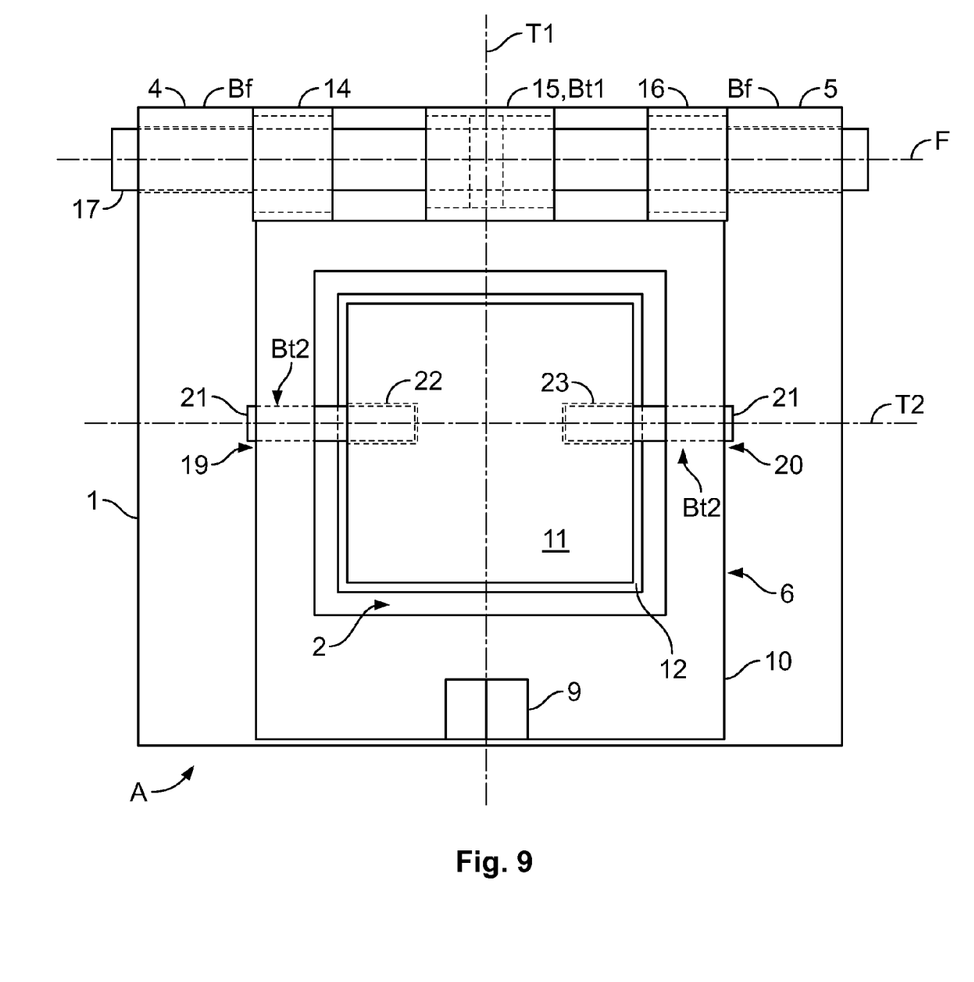
FIG. 9 is a schematic representation in plan view of the test holder according to the invention.

FIG. 9 shows a further exemplary embodiment, the same reference signs being used for elements which correspond in function and structure to the elements of the exemplary embodiments of the previous Figures. For the sake of brevity, only the differences from the previous exemplary embodiments will be looked at.

Here the mounted test holder H is shown in the pivoted-shut state in the plan view A. The base frame 1 is shown connected to the lid frame 10 of the pressing means 6 by means of the hinge pin 17. The longitudinal axis of the hinge pin 17 and the longitudinal axes of the receptacle or bores 4, 14, 15, 16, 5 are aligned with the pivot axis F, about which the pressing device 6 may be pivoted out of the image plane. As is readily apparent here, the bores 14, 16 of the lid frame 10 have a larger diameter than the hinge pin 17 passed therethrough. The receptacles 4, 5 of the base frame 1 are, on the other hand, configured to fit the hinge pin 17, and guide the hinge pin 17 such that it is rotatable substantially without play. The profile of the middle receptacle 15 of the lid frame 10 comprises a taper, which has a diameter, at least in a direction extending perpendicularly to the hinge pin, which corresponds roughly to the diameter of the hinge pin 17. The midpoint of this diameter lies on the first tilting axis T1.

The internal walls of the receptacles 4, 15, 5 may be coated with a solid lubricant or for example radial ball bearings may also be provided in the receptacles 4, 15, 5, which radial ball bearings allow easy rotation of the hinge pin 17 or easy pivoting open and shut of the pressing means 6.

The lid frame 10 is thus connected with the hinge pin 17 in such a way as to be tiltable about the first tilting axis T1 extending perpendicularly to the hinge pin 17. The tilt range of the lid frame 10 is restricted by the bores 14, 16.

In the mounted, pivoted-shut state of the pressing means 6, the bearing 9 is arranged on a side of the lid frame 10 facing away from the base frame 1 and faces away from the base frame 1 or from the lid frame 10.

The pressure body 11 is shown inserted in the through receptacle or opening 12 of the lid frame 10. The pressure body 11 is connected to the lid frame 10 in such a manner as to be tiltable about the second tilting axis T2 extending perpendicularly to the first tilting axis T1 by way of two connecting pins 21, which are inserted through the pin receptacles 19, 20 in the lid frame 10 into the bores 22, 23 in the pressure body 11.

Figure 10:
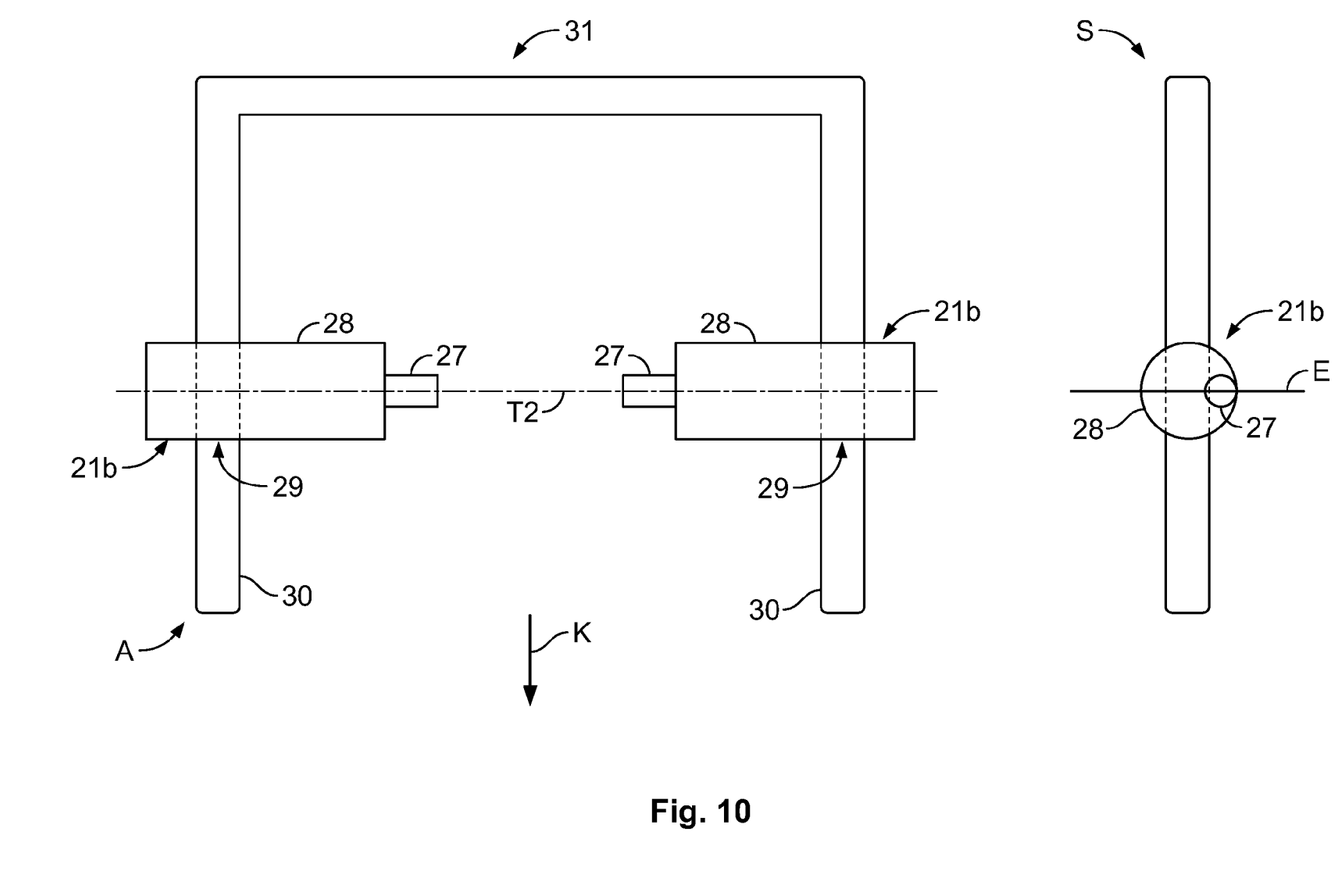
FIG. 10 is a schematic representation of a further exemplary embodiment of the invention showing a spring clip according to the invention.

FIG. 10 shows a further exemplary embodiment, the same reference signs being used for elements which correspond in function and structure to the elements of the exemplary embodiments of the previous Figures. For the sake of brevity, only the differences from the previous exemplary embodiments will be looked at.

The connecting pins 21*b* here comprise bores 29 extending perpendicularly to a plane E defined by the longitudinal axes of said pins. The plane E extends perpendicularly to the plane of the drawing along the second tilting axis T2. One of two webs 30 pointing in a direction K of a substantially U-shaped spring clip 31 is inserted into each of the bores 29 in two connecting pins 21*b*.

Both the bores 29 and the webs 30 are here of circular cross-section. The cross-sections of the bores 29 and the webs 30 may however also be different in shape and in particular be complementary to one another and in each case be in themselves point-symmetrical. In this way, a connecting pin 21*b* may be placed onto the webs 30 in at least two different positions, if the pegs 27 are directed towards one another along the second tilting axis T2.

Mounted on the spring clip 31, the connecting pins 21*b* may be easily mounted and removed again.

Figure 11:
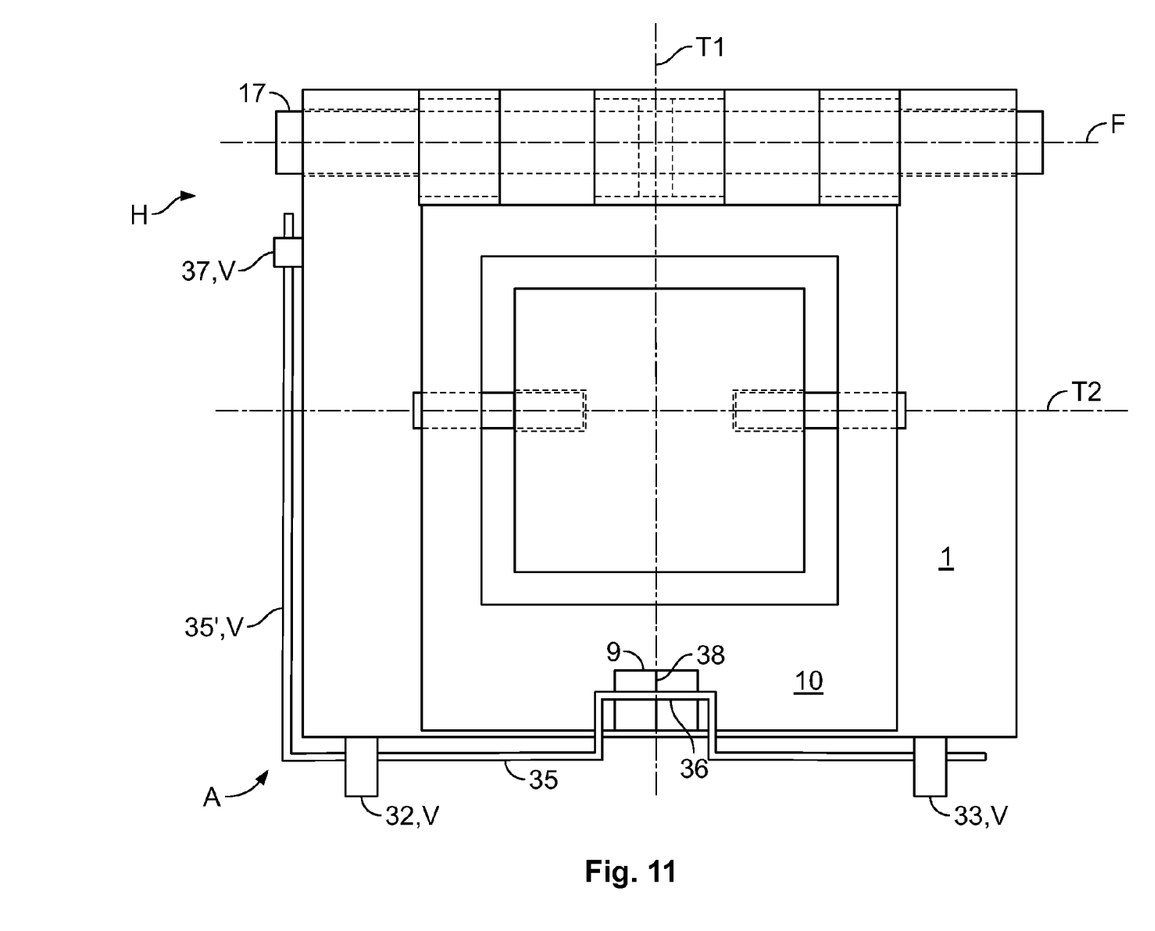
FIG. 11 is a schematic representation in plan view of the test holder according to the invention showing a closing mechanism.

FIG. 11 shows a further exemplary embodiment, the same reference signs being used for elements which correspond in function and structure to the elements of the exemplary embodiments of the previous Figures. For the sake of brevity, only the differences from the previous exemplary embodiments will be looked at.

The test holder H is here shown in a plan view A in the pivoted-shut state. The lid frame 10 rests on the base frame 1 and is pressed by a closing mechanism V towards the base frame and thus held in the pivoted-shut position.

The closing mechanism V comprises two holding eyelets 32, 33, which are formed in one piece with the base frame on the opposite side from the pivot axis in the outer, mutually opposing regions of said side. The holding eyelets 32, 33 comprise openings extending parallel to the pivot axis F, which rotatably accommodate a closing lever. Between the holding eyelets 32, 33 the closing lever 35 comprises a protrusion 36 configured symmetrically relative to the first tilting axis T1, which protrusion is arranged over the lid frame 10 so as to press it towards the base frame 1. At a right angle to the part of the closing lever 35 guided between the holding eyelets 32, 33, an actuating lever 35' extends to the side of the base frame 1 substantially parallel to the first tilting axis T1 and towards the hinge pin 17. Above the second tilting axis T2, a hook-on device in the form of a clamping lug 37 is arranged on the side of the base frame 1, under which the closing lever 35' is held resiliently. If the closing lever 35' is then released from the base frame 1 away from the clamping lug 37 and pivoted upwards out of the plane of the drawing about the receptacles of the holding eyelets 32, 33, the protrusion 36 follows this movement and consequently no longer presses the lid frame 10 towards the base frame 1.

The resilient contact pressure applied by the closing lever 35 and pressing the lid frame 10 towards the base frame 1 may be adaptable to the requirements of the microchip to be tested in each case. For example, the contact pressure may be adapted by changing the position of the clamping lug 37, the size and/or orientation of the protrusion 36 relative to the actuating element 35' or by adjusting the second tilting bearing. The protrusion 36 of the closing lever 35 presses onto an edge 38 of the bearing 9 which determines the bearing axis of the bearing 9 and extends parallel to the first tilting axis T1. The bearing 9 here takes the form of a cylinder with a triangular base, whose longitudinal axis extends parallel to the first tilting axis T1, one side of the triangle forming the base resting flat on the side of the lid frame 10 facing away from the base frame 1. The bearing 9 may also be differently configured, for example pyramid-shaped, the apex thereof pointing away from the lid frame 10, the apex lying on the first tilting axis T1 in the plan view illustrated.

As a result of this pressing connection of the protrusion 36 with the bearing 9, the lid frame 10 is pressed towards the base frame 1, the lid frame 10 remaining tiltable about the first tilting axis T1. In this way, the pressing means 6 is closed against undesired opening.

The invention claimed is:

1. A test holder for at least one microchip, comprising a base frame having at least one central opening, which encloses at least one receptacle for the microchip, and having a pressing means, which is connected to the base frame by way of a pivot bearing such that it can be pivoted open about a pivot axis in the direction away from the central opening and pivoted shut in the direction towards the central opening, wherein the pressing means is connected tiltably to the base frame by way of a first tilting bearing, which comprises a first tilting axis extending perpendicularly to the pivot axis, the pressing means comprising at least one pressure body arranged over the receptacle for the microchip when the pressing means is pivoted shut, which pressure body is mounted in the pressing means by way of a second tilting bearing so as to be tiltable about a second tilting axis, the second tilting bearing comprises two connecting pins, by means of which the pressure body is connected tiltably to a lid frame of the pressing means, and further comprising a closing mechanism which presses the lid frame towards the base frame when the pressing means is in the closed state, the pressure exerted by the closing mechanism being distributed symmetrically about the first tilting axis.

2. A test holder according to claim 1, wherein the pivot bearing and the first tilting bearing jointly comprise a hinge pin accommodated in the base frame, which hinge pin is oriented along the pivot axis.

3. A test holder according to claim 2, wherein the pressing means comprises at least two limit stops for the hinge pin arranged on one or both sides of the first tilting bearing and directed towards the hinge pin, by means of which limit stops the tilting angle of the first tilting bearing is restricted.

4. A test holder according to claim 1, wherein the connecting pins are spaced from one another and mounted in mutual alignment in the pressing means and are in each case guided by a pin receptacle of the lid frame as far as into two bores provided in the pressure body and extending, when the pressure body is in the mounted state, substantially along the second tilting axis.

5. A test holder according to claim 1, wherein the pressure body is accommodated exchangeably in the lid frame.

6. A test holder according to claim 1, wherein the first and second tilting axes intersect with one another over the midpoint of the receptacle for the microchip when the pressing means is in the closed state.

7. A test holder according to claim 1, wherein the first tilting bearing comprises a further bearing, by means of which the position of the first tilting axis is determined when the pressing means is pivoted shut and closed by the closing mechanism.

8. A test holder according to claim 7, wherein the further bearing takes the form of a bearing arranged on the opposite side of the lid frame from the pivot axis facing away from the base frame, by means of which bearing the lid frame is pressed, when the pressing means is in the pivoted-shut state, tiltably about the first tilting axis towards the base frame.

9. A test holder according to claim 1, wherein a height-adjusting means is provided, with which the distance between the pressure body and the opposite end of the central opening may be modified.

10. A test holder according to claim 9, wherein the height-adjusting means comprises two connecting pins with in each case a first and a second peg, the pegs being arranged eccentrically relative to one another and extending parallel to one another.

11. A test holder according to claim 10, wherein, in the mounted state, the first peg is arranged in one of the bores of the pressure body and the second peg is arranged in one of the pin receptacles of the lid frame.

12. A test holder according to claim 10, wherein a U-shaped spring clip with two webs pointing in one direction is provided, which webs are in each case configured with a mount for the connecting pins, it being possible, using the spring clip, to fix the position of the connecting pins in the pressing means.

* * * * *